US00RE38045E

(19) United States
(12) Reissued Patent
Cometti et al.

(10) Patent Number: US RE38,045 E
(45) Date of Reissued Patent: Mar. 25, 2003

(54) DATA COMPENSATION/RESYNCHRONIZATION CIRCUIT FOR PHASE LOCK LOOPS

(75) Inventors: Aldo Giovanni Cometti, San Diego, CA (US); R. Frank O'Bleness, Del Mar, CA (US)

(73) Assignee: STMicroelectronics, Inc., Carrollton, TX (US)

(21) Appl. No.: 09/612,540

(22) Filed: Jul. 7, 2000

(Under 37 CFR 1.47)

Related U.S. Patent Documents

Reissue of:
(64) Patent No.: 5,777,498
Issued: Jul. 7, 1998
Appl. No.: 08/758,962
Filed: Dec. 2, 1996

(51) Int. Cl.[7] ..... H03L 7/06
(52) U.S. Cl. ..... 327/156; 327/159; 327/292
(58) Field of Search ..... 327/292, 294, 327/299, 244, 245, 147–150, 156–159; 331/1 A, 25

(56) References Cited

U.S. PATENT DOCUMENTS 5,307,381 A 4/1994 Ahuja ..... 375/107
5,406,590 A * 4/1995 Miller et al. ..... 375/159

FOREIGN PATENT DOCUMENTS

EP 0 366 326 A 2/1990

OTHER PUBLICATIONS

Thaik A. et al., *A Dual PLL Based Multi Frequency Clock Distribution Scheme*, Proceedings of the Symposium On VLSI Circuits, Seattle, Jun. 4–6, 1992, No. 4, Jun. 1992, Institute of Electrical And Electronics Engineers, pp. 84–85.

Annamalai K., *Zero–Delay, Low–Skew, Multi–Phase Clock Drivers For 1486™ & R3000 Applications*, Wescon Technical Papers, vol. 35, Nov. 1, 1991, pp. 85–90.

* cited by examiner

*Primary Examiner*—Tuan T. Lam
(74) *Attorney, Agent, or Firm*—Lisa K. Jorgenson; Bryan A. Santarelli

(57) ABSTRACT

A circuit that compensates for delays induced by clock generation logic and distributed clock drivers in phase lock loop applications is disclosed. The circuit is a phase lock loop (PLL) which contains a clock synchronization circuit that operates to synchronize a transition edge of a signal generated by a frequency divider against a distributed clock signal generated by a clock output driver of the circuit. The synchronization occurs unless the clock synchronization circuit is disabled.

41 Claims, 2 Drawing Sheets

DATA COMPENSATION/ RESYNCHRONIZATION CIRCUIT FOR PHASE LOCK LOOPS

Matter enclosed in heavy brackets [ ] appears in the original patent but forms no part of this reissue specification; matter printed in italics indicates the additions made by reissue.

BACKGROUND OF THE INVENTION

The present invention relates to circuits that directly compensate for delays induced by clock generation logic and distributed clock drivers in phased-lock loop (PLL) applications.

Referring to FIG. 1, a prior art clock generation/distribution block diagram 100 is shown. External Reference Clock 102, REF CLK, is applied to one input of Phase Detector 105, and Frequency Divider Output Signal 155 is applied to the other input of Phase Detector 105. When the PLL is locked, External Reference Clock 102 and Frequency Divider Output Signal 155 are the same frequency. The output of Phase Detector 105, which is a DC voltage representing the phase difference between External Reference Clock 102 and Frequency Divider Output Signal 155, is applied to the input of Loop Filter 110.

Loop Filter 110 is a low pass filter with gain, and is used to set dynamic PLL characteristics. The output of Loop Filter 110 is applied to the input of Voltage Controlled Oscillator (VCO) 115. The output of Voltage Controlled Oscillator 115 is Voltage Controlled Oscillator Output Signal 150, a variable frequency which is a function of the Voltage Controlled Oscillator 115 input. Voltage Controlled Oscillator Output Signal 150 is applied to the input of Divide-by-N Frequency Divider 135, that divides the frequency of Voltage Controlled Oscillator Output Signal 150 by the number N. Divide-by-N Frequency Divider 135 is programmed by Programming Input Signal 180 PROG. Frequency Divider Output Signal 155 is applied to one input of Phase Detector 105 as previously mentioned.

Voltage Controlled Oscillator Output Signal 150 is routed to a multiplicity of output clock drivers, being First Clock Driver 120, Second Clock Driver 125, . . . Nth Clock Driven 130. Each clock driver outputs a distributed clock, these being First Distributed Clock Output Signal 137, Second Distributed Clock Output Signal 140, . . . Nth Distributed Clock Output Signal 145, respectively. The accumulated delay of interest occurs between Voltage Controlled Oscillator Output Signal 150 and each of the distributed clocks, First Distributed Clock Output Signal 137, Second Distributed Clock Output Signal 140, . . . , and Nth Distributed Clock Output Signal 145.

The detrimental effects of unwanted and uncontrolled delays on the operation of digital circuitry are well known. Because digital circuitry operation in general depends upon the timing accuracy of logic transition edges, such as the transition from logic low to logic high or from logic high to logic low, the general effect of uncontrolled digital delays is to affect either the ability of a circuit to clock on the proper transition edge due to delay accumulation or to intermittently clock on the correct edge due to variations in accumulated delay. This latter effect can also manifest itself as noise in circuits whose final performance depends upon the regularity of clock edges in order to achieve high spectral purity, as is the case in frequency synthesizers which use PLLs.

All of the common digital logic elements contain detailed timing data as part of their data sheets. This information is provided to allow the designer to make proper timing budgets or allocations for the application of signals to the various functional inputs of the logic element so as to ensure proper circuit operation. The data sheets also contain timing information relative to the internal delays of the logic element so that output signals tray be characterized in time with respect to input signals.

Large digital circuits can require special software simulation tools is order to characterize the delay safety margins and problem areas, and unless this is done overall circuit performance can become problematical at best due to unforeseen delay accumulations. The extent of the problem is increased because the delay of logic elements is typically also a function of temperature, thus unwanted accumulated delays vary with temperature.

All the foregoing are well known to the art. An additional consideration, also known to the prior art, is the increase in sensitivity to delay problems as the frequency of circuit operation increases. This is due to the fact that unwanted accumulated delays which may not be of great importance at low frequencies may become critical at higher frequencies. Since the state of the art is toward increasing frequency of operation, as in communications equipment or computer equipment, the requirements for analysis and compensation of unwanted delays continues to be relevant.

In addition to the above causes for unwanted digital delays, there also are transmission line effects which become important as the frequency of operation increases. The interconnection tracks on printed circuit boards must be considered as transmission lines at high frequencies, and require proper termination and layout for optimum performance. These transmission line effects are a source of additional unwanted delay to digital signals, and the departure from ideal transmission line performance causes distortion in digital signals which often produce changes in the timing of edges.

Undesired signal delays have been an integral part of system design considerations for years. One example of system level considerations is the effect of signal delays on the distribution of supposedly identical clocks throughout a system In this application the signal delays can be different to each drop point of a distributed clock, for example, which means that the relative timing information contained in the edges of a digital clock varies from drop point to drop point. The frequency does not change, but the accuracy of edge timing may be compromised throughout the system.

One prior art approach to resolve this situation is to overspecify the digital elements involved in the clock distribution system, so that extremely small incremental delays are achieved and the magnitude of the worst case total delay error is held within desired limits. This approach has penalties in cost, power and increased generation of electromagnetic interference due to faster logic elements being used.

Another prior art approach is to compensate for differences in delay at drop points by inserting compensation delay in the paths with least delay, typically by inserting otherwise unneeded logic elements in series with a low delay path to increase delay. This approach has the disadvantages that cost increases, power efficiency decreases, parts count increases, the delay of individual logic elements varies from part to part and with temperature, and close matching of overall delay between distribution drop points may, in the final analysis, not be practical.

There is thus an unmet need in the art to be able to utilize a method for PLL clock distribution which does not have the disadvantage of large differences in logic signal edge timing between different drop points. Therefore, it would be advantageous in the art to be able to describe a method and structure for distributing PLL digital clock signals in which the delays between drop points are compensated by a method which has predictable performance.

SUMMARY OF THE INVENTION

The present invention discloses a circuit that compensates for delays induced by clock generation logic and distributed clock drivers in phase lock loop applications is disclosed. The circuit of the present invention contains a clock synchronization circuit that operates to synchronize a transition edge of a signal generated by a frequency divider against a distributed clock signal generated by a clock output driver of the circuit. The synchronization occurs unless the clock synchronization circuit is disabled.

According to a first embodiment of the present invention, the circuit comprises a phase detector which receives a reference clock signal and generates a voltage signal representative of a phase difference between the reference clock signal and another input signal to the phase detector; a loop filter that receives the voltage signal generated by the phase detector element and generates an output signal; a voltage controlled oscillator (VCO) that receives the output signal of the loop filter and generates a frequency signal that varies according to the output signal of the loop filter; a frequency divider that receives the frequency signal generated by the voltage controlled oscillator element and a programming signal as input signals and generates a frequency divider signal as an output signal; a clock output driver that receives the frequency signal generated by the voltage controlled oscillator as an input signal and that generates a distributed clock signal; and the clock synchronization circuit that receives the frequency divider signal, the distributed clock signal, and a control signal as input signals and generates a signal that is another input signal of the phase detector. The clock output driver may be one of a number of clock output drivers.

The clock synchronization circuit operates to synchronize transition edges of the frequency divider signal generated by the frequency divider element using the distributed clock signal generated by the clock output driver element unless the clock synchronization element is disabled by the control signal. The clock synchronization circuit has a control element and a logic element that perform the synchronization. The control element that receives the distributed clock signal and the control signal as input signals and generates a control output signal. The logic element receives the control output signal, the distributed clock signal, and the frequency divider signal as input signals and generates the output signal of the clock synchronization element. The logic element samples the frequency divider signal on a transition edge of the distributed clock signal in order to synchronize the transition edge of the frequency divider signal unless the control output signal generated by the control element disables the logic element.

According to a second embodiment of the present invention, the circuit additionally has another frequency divider and a state machine circuit interposed between the VCO and the clock output driver.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing(s), wherein:

DESCRIPTION OF THE INVENTION

The present invention describes a circuit technique and structure which directly compensates for delays induced by clock generation logic and distributed clock drivers in Phase Lock Loop (PLL) applications. In addition, because the present invention is process independent it offers a substantial reliability improvement over process-dependent delay compensation circuits in that the present invention is predictable in operation.

Figure 1:
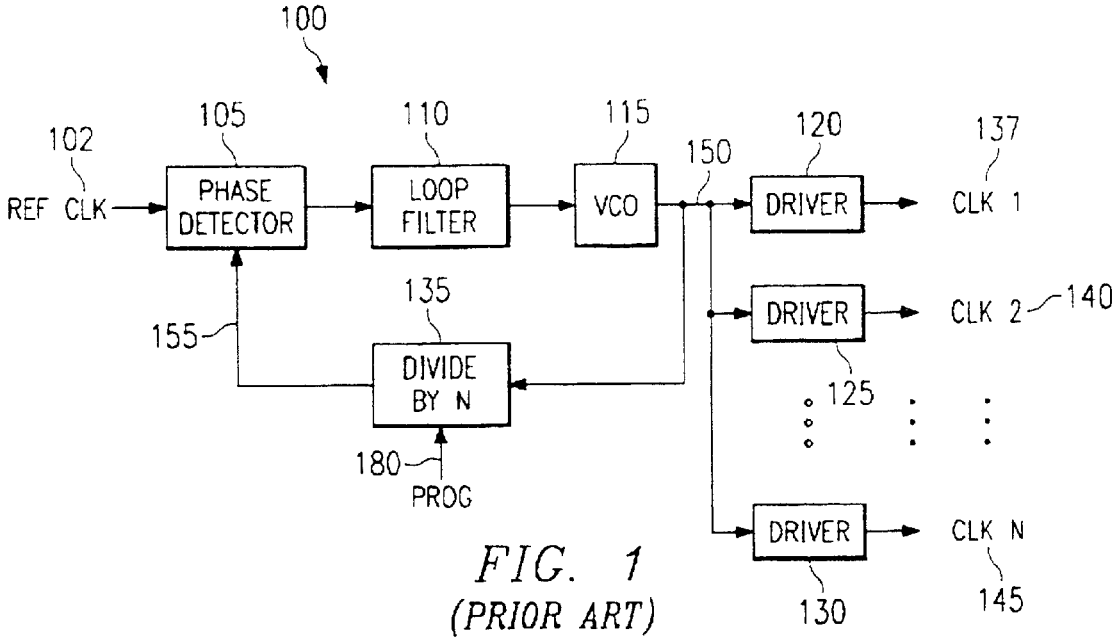
FIG. 1 (PRIOR ART)
FIG.1 is a Clock Generation/Distribution Block Diagram, according to the prior art.
Figure 2:
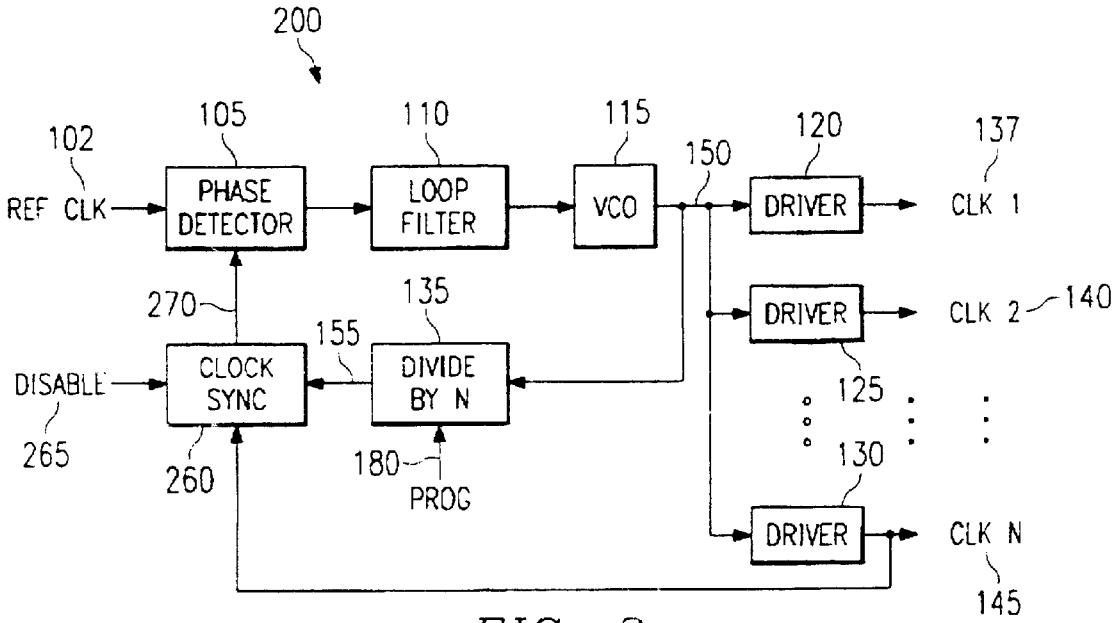
FIG. 2 is a Clock Generation/Distribution Block Diagram, according to a first embodiment of the sent invention.

Referring to FIG. 2, clock generation/distribution block diagram 200 is shown. Note that FIG. 2 has Clock Sync Circuit 260 which is not present in FIG. 1. The purpose of Clock Sync Circuit 260 is to use one of the distributed clocks, Nth Distributed Clock Output Signal 145, to resynchronize the transition edges of Frequency Divider Output Signal 155 so as to effectively remove accumulated delays incurred between Voltage Controlled Oscillator Output Signal 150 and Nth Distributed Clock Output Signal 145 before the signal is applied to the input of the phase detector as Clock Sync Circuit Output Signal 270. Clock Sync Circuit Disable Input Signal 265 is utilized to disable the synchronization operation of Clock Sync Circuit 260, if desired, in which case Clock Sync Circuit Output Signal 270 is functionally equivalent to Frequency Divider Output Signal 155.

Figure 3:
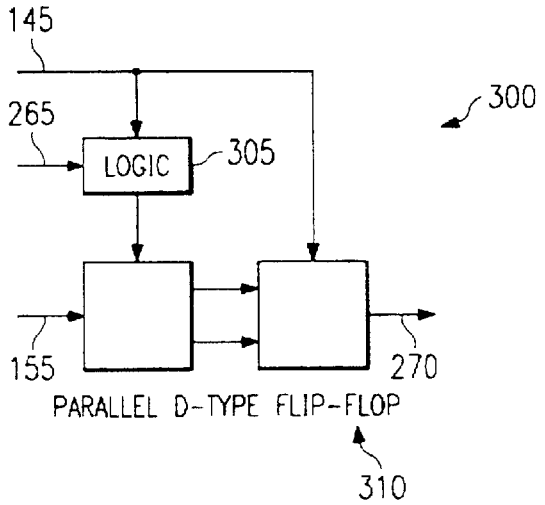
FIG. 3 is a Clock Sync Block Diagram.

A more detailed explanation of Clock Sync Circuit 260 is presented in FIG. 3 as Clock Sync Block Diagram 300. Frequency Divider Output Signal 155 is sampled on both the rising and falling edges of Nth Distributed Clock Output Signal 145. This ensures that Clock Sync Circuit Output Signal 270 will exactly follow the input even when Nth Distributed Clock Output Signal 145 is a fractional-multiplier of the system clock (i.e., 1.5×, 2.5×, etc.). Clock Sync Disable Logic Circuit 305 is used to enable both parts of the master stage of Parallel D-type Flip-Flop 310. In this condition, Parallel D-type Flip-Flop 310 becomes transparent on either edge of Nth Distributed Clock Output Signal 145 since one of the paths in the slave stage will be enabled. This mode is necessary to allow the PLL to remain locked in a free-running state even if Nth Distributed Clock Output Signal 145 is disabled (the PLL must have a feedback path in order to remain locked). Clock Sync Circuit 260 will resynchronize Clock Sync Circuit Output Signal 270 to Nth Distributed Clock Output Signal 145 on the first rising or falling edge of Nth Distributed Clock Output Signal 145, after Clock Sync Circuit Disable Input Signal 265 has been deasserted. The critical path in Clock Sync Circuit 260 is the propagation from Nth Distributed Clock Output Signal 145 to Clock Sync Circuit Output Signal 270 at the slave stage of Parallel D-type Flip-Flop 310. Parallel D-type Flip-Flop 310 should be designed to minimize the effect of this delay.

Figure 4:
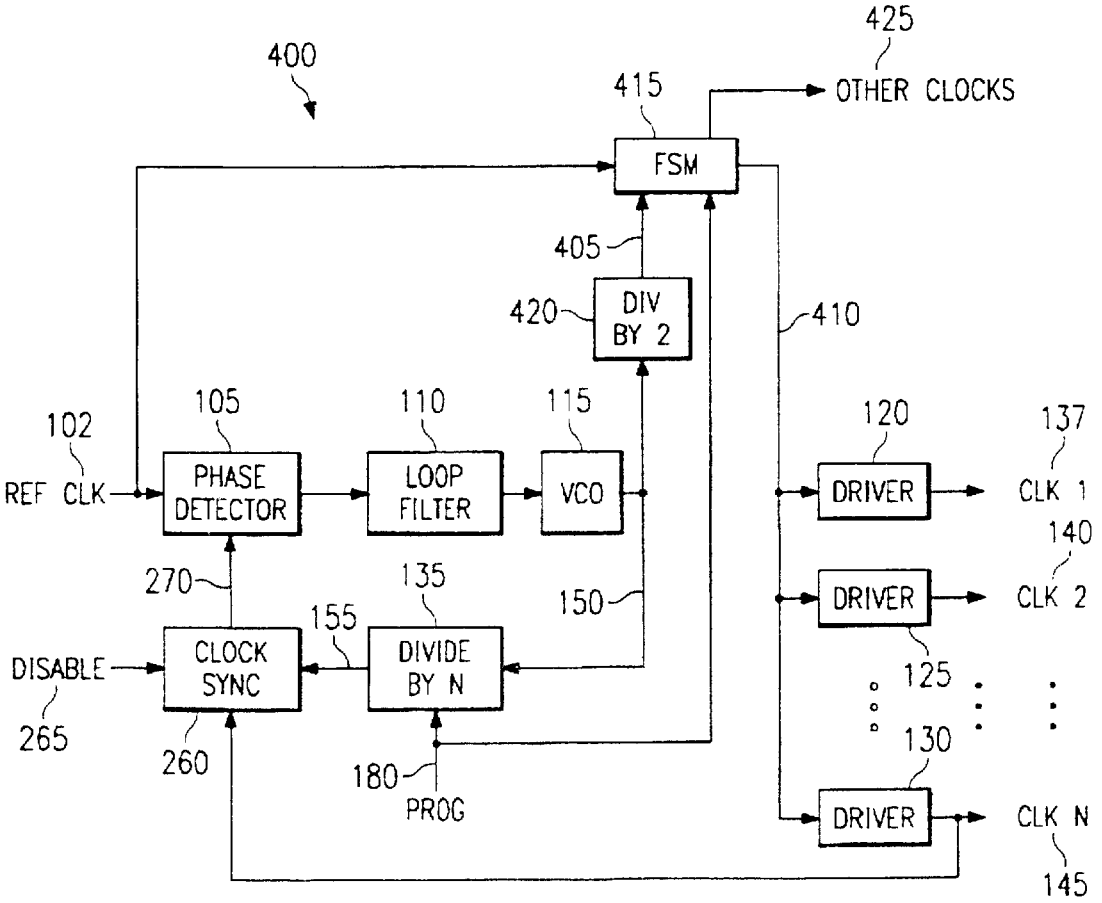
FIG. 4 is a Clock Generation/Distribution Block Diagram, according to a second embodiment of the present invention.

Referring to FIG. 4, which is a Block Diagram of a second embodiment of a clock generation/distribution system, it will be seen that Divide-by-2 Frequency Divider 420 and State Machine Circuit 415 have been added to the system of FIG. 2. Divide-by-2 Frequency Divider 420 is used to divide the frequency of Voltage Controlled Oscillator Output Signal 150 by two, producing Divide-by-2 Frequency Divider Output Signal 405. Divide-by-2 Frequency Divider Output Signal 405. External Reference Clock 102 and Programming Input Signal 180 are applied as inputs to State Machine Circuit 415.

State Machine Circuit 415 is a logic block which, using prior art techniques, sequences through predefined logic states to produce the different output frequencies State Machine Circuit First Output Signal 410 and State Machine Circuit Second Output Signal 425. State Machine Circuit First Output Signal 410 is used as the input for First Clock Driver 120, Second Clock Driver 125, . . . Nth Clock Driver 130 instead of Voltage Controlled Oscillator Output Signal 150 (reference FIGS. 1 and 2). Divide-by-N Frequency Divider 135, Second Distributed Clock Output Signal 140 . . . Nth Distributed Clock Output Signal 145 are at a frequency determined by State Machine Circuit First Output Signal 410. State Machine Circuit Second Output Signal 425 is included to indicate that other clocks may be output by State Machine Circuit 415 simultaneously with State Machine Circuit First Output Signal 410. The characteristics of any additional clocks will depend on system requirements.

As can be seen from the foregoing description, the present invention will compensate for accumulated delays between the PLL output and an arbitrarily chosen distributed clock. This is possible because of the inclusion of a novel clock sync circuit which synchronizes the output of the PLL with the distributed clock. The PLL output frequency and the frequency of the distributed clock may be different. Delay compensation is provided without the need for adding process dependent delay elements. The present invention essentially minimizes the skew between an external reference input clock and a distributed clock.

While the invention has been particularly shown and described with reference to a preferred embodiment, it will be understood by those skilled in the art that various changes in form and detail may be made therein without departing from the spirit and scope of the invention.

What is claimed is:

1. A circuit that compensates for delays induced by clock generation logic and distributed clock drivers in phase lock loop applications, comprising:

a phase detector element which receives a reference clock signal as a first input signal and which generates a voltage signal representative of a phase difference between the reference clock signal and a second input signal to the phase detector element;

a filter element that has the voltage signal generated by the phase detector element as an input signal and that generates an output signal;

a voltage controlled oscillator element that has the output signal of the filter element as an input signal and that generates a frequency signal, wherein the frequency signal varies according to the input signal of the voltage controlled oscillator element;

a frequency divider element that receives the frequency signal generated by the voltage controlled oscillator element as a first input signal, a programming signal as a second input signal and that generates a frequency divider signal as an output signal;

a clock output driver element that receives the frequency signal generated by the voltage controlled oscillator element as an input signal and that generates a distributed clock signal; and a clock synchronization element that receives the frequency divider signal generated by the frequency divider element as a first input signal, the distributed clock signal of the clock output driver element as a second input signal, a control signal as a third input signal, and that generates an output signal which is the second input signal to the phase detector element, wherein the clock synchronization element operates to synchronize a transition edge of the frequency divider signal generated by the frequency divider element using the distributed clock signal generated by the clock output driver element unless the clock synchronization element is disabled by the control signal.

2. The circuit of claim 1, wherein the clock synchronization element comprises:

a control element that receives the distributed clock signal as a first input signal and the control signal as a second input signal and that generates a control output signal; and a logic element that receives the control output signal generated by the control element as a first input signal, the distributed clock signal as a second input signal, and the frequency divider signal generated by the frequency divider element as a third input signal and that generates the output signal of the clock synchronization element, wherein the logic element samples the frequency divider signal on a transition edge of the distributed clock signal in order to synchronize the transition edge of the frequency divider signal unless the control output signal generated by the control element disables the logic element.

3. The circuit of claim 2, wherein when the control signal is asserted, the control output signal generated by the control element disables the logic element and when the control signal is not asserted, the control output signal generated by the control element does not disable the logic element.

4. The circuit of claim 2, wherein the logic element is a parallel D-type Flip-Flop.

5. The circuit of claim 4, wherein the when the control signal is not asserted, the control output signal generated by the control element enables a master portion and a slave portion of the parallel D-type Flip-Flop.

6. The circuit of claim 2, wherein the logic element samples the frequency divider signal on a first transition edge and a second transition edge of the distributed clock signal.

7. The circuit of claim 6, wherein the first transition edge is the rising edge of the distributed clock signal and the second transition edge is the falling edge of the distributed clock signal.

8. The circuit of claim 1, wherein the filter element is a low pass filter with gain.

9. The circuit of claim 1, wherein the clock output driver is one of a plurality of clock output drivers.

10. The circuit of claim 1, wherein the control signal of the clock synchronization element is a disable control signal.

11. A circuit that compensates for delays induced by clock generation logic and distributed clock drivers in phase lock loop applications, comprising:

a phase detector element which receives a reference clock signal as a first input signal and which generates a voltage signal representative of a phase difference between the reference clock signal and a second input signal to the phase detector element;

a filter element that has the voltage signal generated by the phase detector element as an input signal and that generates an output signal;

a voltage controlled oscillator element that has the output signal of the filter element as an input signal and that generates a first frequency signal, wherein the frequency signal varies according to the input signal of the voltage controlled oscillator element;

a first frequency divider element that receives the first frequency signal generated by the voltage controlled oscillator element as a first input signal, a programming signal as a second input signal, and that generates a first frequency divider signal as an output signal;

a second frequency divider element that receives the first frequency signal generated by the voltage controlled oscillator element and that generates a second frequency divider signal as an output signal;

a state machine element that receives the second frequency divider signal as a first input signal, the reference clock signal as a second input signal, and the programming signal as a third input signal and that generates a second frequency signal;

a clock output driver element that receives the second frequency signal generated by the state machine element as an input signal and that generates a distributed clock signal; and a clock synchronization element that receives the first frequency divider signal generated by the first frequency divider element as a first input signal, the distributed clock signal of the clock output driver element as a second input signal, a control signal as a third input signal, and that generates an output signal which is the second input signal to the phase detector element, wherein the clock synchronization element operates to synchronize a transition edge of the first frequency divides signal generated by the first frequency divider element using the distributed clock signal generated by the clock output driver element unless the clock synchronization element is disabled by the control signal.

12. The circuit of claim 11, wherein the clock synchronization element comprises:

a control element that receives the distributed clock signal as a first input signal and the control signal as a second input signal and that generates a control output signal; and a logic element that receives the control output signal generated by the control element as a first input signal, the distributed clock signal as a second input signal, and the first frequency divider signal generated by the first frequency divider element as a third input signal and that generates the output signal of the clock synchronization element, wherein the logic element samples the first frequency divider signal on a transition edge of the distributed clock signal in order to synchronize the transition edge of the first frequency divider signal unless the control output signal generated by the control element disables the logic element.

13. The circuit of claim 12, wherein when the control signal is asserted, the control output signal generated by the control element disables the logic element and when the control signal is not asserted, the control output signal generated by the control element does not disable the logic element.

14. The circuit of claim 12, wherein the logic element is a parallel D-type Flip-Flop.

15. The circuit of claim 14, wherein the when the control signal is not asserted, the control output signal generated by the control element enables a master portion and a slave portion of the parallel D-type Flip-Flop.

16. The circuit of claim 12, wherein the logic element samples the first frequency divides signal on a first transition edge and a second transition edge of the distributed clock signal.

17. The circuit of claim 16, wherein the first transition edge is the rising edge of the distributed clock signal and the second transition edge is the falling edge of the distributed clock signal.

18. The circuit of claim 11, wherein the filter element is a low pass filter with gain.

19. The circuit of claim 11, wherein the clock output driver is one of a plurality of clock output drivers.

20. The circuit of claim 11, wherein the control signal of the clock synchronization element is a disable control signal.

21. The circuit of claim 11, wherein the state machine element additionally generates a third frequency signal.

*22. A circuit, comprising:*

*a phase detector operable to receive a reference signal and a synchronized signal and to generate a difference signal having a value that is related to a phase difference between the reference and synchronized signals;*

*a signal-controlled oscillator coupled to the phase detector and operable to generate an oscillator signal having as frequency that is related to the value of the difference signal;*

*a driver coupled to the oscillator and operable to generate a buffered oscillator signal from the oscillator signal; and*

*a synchronizer coupled to the phase detector, the oscillator, and the driver, the synchronizer operable to synchronize the oscillator signal to the buffered oscillator signal and to generate the synchronized signal equal to the synchronized oscillator signal.*

*23. The circuit of claim 22 wherein:*

*the phase detector is operable to generate the difference signal having a voltage that is related to the phase difference between the reference and synchronized signals;*

*the signal-controlled d oscillator is operable to generate the oscillator signal having a frequency that is related to the voltage of the difference signal.*

*24. The circuit of claim 22 wherein the synchronizer is operable to generate the synchronized signal having a transition edge that is aligned with a transition edge of the buffered oscillator signal.*

*25. The circuit of claim 22 wherein:*

*the synchronized signal and the buffered oscillator signal each have a respective transition edge; and*

*the synchronizer is operable to align the transition edge of the synchronized signal with the transition edge of the buffered oscillator signal.*

*26. The circuit of claim 22 wherein:*

*the buffered oscillator signal has a transition edge; and*

*the synchronizer is operable to synchronize the oscillator signal to the buffered oscillator signal by sampling the oscillator signal on the transition edge of the buffered oscillator signal.*

*27. The circuit of claim 22 wherein the synchronizer is operable to receive a disable signal and to generate the synchronized signal equal to the unsynchronized oscillator signal in response to the disable signal having a disable value.*

*28. A circuit, comprising:*

*a phase detector operable to receive a reference signal and a synchronized signal and to generate a difference signal having a value that is related to a phase difference between the reference and synchronized signals;*

*a filter coupled to the phase detector and operable to generate from the difference signal a filtered difference signal having a value;*

*a signal-controlled oscillator coupled to the filter and operable to generate an oscillator signal having a frequency that is related to the value of the filtered difference signal;*

*a driver coupled to the oscillator and operable to generate a buffered oscillator signal from the oscillator signal; and*

*a synchronizer coupled to the phase detector, the oscillator and the driver, the synchronizer operable to synchronize the oscillator signal to the buffered oscillator signal and to generate the synchronized signal equal to the synchronized oscillator signal.*

*29. The circuit of claim 28 wherein the filter comprises a low-pass filter.*

*30. The circuit of claim 28 wherein:*

*the phase detector is operable to generate the difference signal having a voltage that is related to the phase difference between the reference and synchronized signals;*

*the filter is operable to generate the filtered difference signal having a voltage; and*

*the signal-controlled oscillator is operable to generate the oscillator signal having a frequency that is related to the voltage of the filtered difference signal.*

*31. A circuit, comprising:*

*a phase detector operable to receive a reference signal and a synchronized signal and to generate a difference signal having a value that is related to a phase difference between the reference and synchronized signals;*

*a filter coupled to the phase detector and operable to generate from the difference signal a filtered difference signal having a value;*

*a signal-controlled oscillator coupled to the filter and operable to generate an oscillator signal having a first frequency that is related to the value of the filtered difference signal;*

*a driver coupled to the oscillator and operable to generate a buffered oscillator signal from the oscillator signal;*

*a frequency divider coupled to the oscillator and operable to generate from the oscillator signal a frequency-divided oscillator signal having a second frequency that is lower than the first frequency; and*

*a synchronizer coupled to the phase detector, the frequency divider, and the driver, the synchronizer operable to synchronize the frequency-divided oscillator signal to the buffered oscillator signal and to generate the synchronized signal equal to the synchronized frequency-divided oscillator signal.*

*32. The circuit of claim 31 wherein:*

*the buffered oscillator signal has a transition edge; and*

*the synchronizer is operable to synchronize the frequency-divided oscillator signal to the buffered oscillator signal by sampling the frequency-divided oscillator signal on the transition edge of the buffered oscillator signal.*

*33. The circuit of claim 31 wherein the synchronizer is operable to receive a disable signal and to generate the synchronized signal equal to the unsynchronized frequency-divided oscillator signal in response to the disable signal having a disable value.*

*34. A method, comprising:*

*generating an oscillator signal having as a frequency that is related to a phase difference between a reference signal and a synchronized signal;*

*distributing the oscillator signal; and*

*generating the synchronized signal by synchronizing the oscillator signal to the distributed oscillator signal.*

*35. The method of claim 34 wherein generating the synchronized signal comprises aligning a transition edge of the synchronized signal with a transition edge of the distributed oscillator signal.*

*36. The method of claim 34 wherein generating the synchronized signal comprises:*

*sampling the oscillator signal on transitions edge of the distributed oscillator signal; and*

*generating the synchronized signal equal to the samples of the oscillator signal.*

*37. The method of claim 34 wherein generating the synchronized signal comprises setting the synchronized signal equal to the oscillator signal during a synchronization-disable mode.*

*38. A method, comprising:*

*generating an oscillator signal having a frequency that is related to a phase difference between a reference signal and a synchronized signal;*

*distributing the oscillator signal;*

*reducing the frequency of the oscillator signal; and*

*generating the synchronized signal by synchronizing the reduced-frequency oscillator signal to the distributed oscillator signal.*

*39. The method of claim 38 wherein generating the synchronized signal comprises aligning a transition edge of the synchronized signal with a transition edge of the distributed oscillator signal.*

*40. The method of claim 38 wherein generating the synchronized signal comprises:*

*sampling the reduced-frequency oscillator signal on transitions edge of the distributed oscillator signal; and*

*generating the synchronized signal equal to the samples of the reduced-frequency oscillator signal.*

*41. The method of claim 38 wherein generating the synchronized signal comprises setting the synchronized signal equal to the reduced-frequency oscillator signal during a synchronization-disable mode.*

* * * * *